United States Patent [19]

Mizoguchi et al.

[11] Patent Number: 4,919,779
[45] Date of Patent: Apr. 24, 1990

[54] METHOD FOR PRODUCING ELECTRICALLY CONDUCTIVE CARBON FILM

[75] Inventors: Akira Mizoguchi; Jun Shioya; Yoichi Yamaguchi; Yoshinobu Ueba, all of Osaka, Japan

[73] Assignee: Director-General, Agency of Industrial Science and Technology, Tokyo, Japan

[21] Appl. No.: 233,415

[22] Filed: Aug. 17, 1988

[30] Foreign Application Priority Data

Aug. 21, 1987 [JP] Japan ................................ 62-206263

[51] Int. Cl.$^5$ .......................... C23C 14/00; B05D 3/06
[52] U.S. Cl. .................................... 204/192.31; 427/38
[58] Field of Search .................... 502/5, 180, 418, 437, 502/438, 413; 427/38; 204/192.31

[56] References Cited

U.S. PATENT DOCUMENTS 4,173,090 12/1987 Yokoe et al. ..................... 502/413
4,795,656 1/1989 Mizuguchi et al. ................. 427/38

Primary Examiner—Paul E. Konopka
Attorney, Agent, or Firm—Cushman, Darby & Cushman

[57] ABSTRACT

A carbon film having a larger electrical conductivity is produced on a substrate by an ion beam method comprising steps of ionizing an organic compound having at least one substituent selected from the group consisting of a carbonyl group, an aldehyde group, an acyl group, an acid anhydride group, an amino group, a nitro group, a hydroxyl group, an alkoxyl group, a thiol group and a halogen or a cluster of said organic compound with an ion beam which accelerates ionized species towards a substrate by an electric field and forming a carbon film on the substrate.

3 Claims, 2 Drawing Sheets

METHOD FOR PRODUCING ELECTRICALLY CONDUCTIVE CARBON FILM

BACKGROUND OF THE INVENTION

1. Field of the Invention

The present invention relates to a method for producing an electrically conductive carbon film.

2. Description of the Related Art

Hitherto, an electrically conductive carbon film has been generally produced by pyrolysis (cf. Otani et al, "Basis for Carbonization Technology" 1980 (Ohm Publishing, Japan)).

This method comprises heating a reaction system in an atmosphere containing a gaseous hydrocarbon such as methane, ethane, propane and benzene to decompose the hydrocarbon and forming a carbon film on a substrate.

A typical carbon film produced by pyrolysis has an electrical conductivity at room temperature of about 70 S/cm, 2 S/cm and $10^{-3}$ S/cm when the pyrolysis temperature is 1,000° C., 700° C. and 500° C., respectively. These results indicate that the electrical conductivity of the carbon film decreases as the pyrolysis temperature decreases, and the carbon film becomes an electrical insulator when the pyrolysis temperature is lower than 500° C. Therefore, by the conventional method, no carbon film having good electrical conductivity has produced at a lower pyrolysis temperature, namely a lower substrate temperature.

To produce a carbon film having a good electrical conductivity at a lower pyrolysis temperature, it has been proposed to use a raw material which decomposes at a lower temperature than the usual hydrocarbons. Otani et al produced a carbon film having an electrical conductivity of 230 S/cm and 180 S/cm on an artificial graphite substrate by pyrolysis of cis-1,2-dichloroethylene at a temperature of 1,100° C. and 700° C., respectively (cf. The Journal of the Chemical Society of Japan, (4) 494 (1979)). M. L. Kaplan et al produced a carbon film having an electrical conductivity of 250 S/cm on a quartz substrate by pyrolysis of 3,4,9,10-perylenetetracarboxylic dianhydride at a temperature of 700° to 900° C. (cf. Appl. Phys. Lett., 36 (10), 867 (1980)). Z. Iqubal et al reported that a carbon film having an electrical conductivity of 15 S/cm and $10^{-2}$ S/cm was formed by pyrolysis of 3,4,9,10-perylenetetracarboxylic dianhydride in a stream of a mixture of argon and hydrogen at a temperature of 800° to 900° C. and 530° C., respectively (cf. Mol. Cryst. Liq. Cryst., 118, 103 (1985)).

On the other hand, to produce a carbon film having a large electrical conductivity on a low temperature substrate, a method other than pyrolysis has been proposed. Mizoguchi et al produced a carbon film having an electrical conductivity of 150 S/cm and 95 S/cm by ion beam deposition on a quartz substrate at a temperature of 1,000° C. and 400° C., respectively (cf. Ext. Abs. Progr. Bienn. Conf. Carbon, 18th., 358-359 and copending U.S. patent application Ser. No. 183,526.).

M. L. Kaplan et al reported that a carbon film having an electrical conductivity of about $10^3$ S/cm was produced by ion implantation of $10^{17}/cm^2$ of Ar ion at 2 MeV into a film formed by vacuum deposition of 3,4,9,10-perylenetetracarboxylic dianhydride (cf. Appl. Phys. Lett., 41(8), 708 (1982)).

According to the conventional pyrolysis, when the hydrocarbon such as methane and ethane is used as a raw material, the carbon film having the electrical conductivity of 70 S/cm was produced at 1,000° C., while the carbon film having the electrical conductivity of only about $10^{-3}$ S/cm was produced at 500° C. Therefore, at a lower substrate temperature, the electrical conductivity of the carbon film greatly decreases.

When 3,4,9,10-perylenetetracarboxylic dianhydride which is more easily decomposed than the hydrocarbons is used, the electrical conductivity of the carbon film is slightly increased to 15 to 250 S/cm at a temperature of 700° to 900° C. and to $10^{-2}$ S/cm at 530° C. But, this increase of the electrical conductivity is not significant.

When cis-1,2-dichloroethylene is used as a raw material, the carbon film has the electrical conductivity of 230 S/cm at 1,100° C. and 180 S/cm at 700° C. However, a corrosive gas is generated during pyrolysis, which is not practically acceptable.

In case where the ion beam is used for producing the electrically conductive carbon film, the carbon film has a comparatively large electrical conductivity at a synthesis temperature of 400° C. or higher. However, the hydrocarbon such as benzene is used as a raw material, no electrical conductive carbon film is produced at a synthesis temperature of lower than 400° C.

Further, the carbon film which is produced at room temperature by ion implantation in the vacuum deposited film of 3,4,8,10-perylenetetracarboxylic dianhydride has a large electrical conductivity of $10^3$ S/cm. But, this technique requires two production steps, namely vacuum deposition and ion implantation and large equipment.

SUMMARY OF THE INVENTION

An object of the present invention is to provide an improved method for producing an electrically conductive carbon film from an easily decomposable organic compound by an ion beam method.

This and other objects of the present invention is accomplished by a method for producing an electrically conductive carbon film comprising steps of ionizing an organic compound having at least one substituent selected from the group consisting of a carbonyl group, an aldehyde group, an acyl group, an acid anhydride group, an amino group, a nitro group, a hydroxyl group, an alkoxyl group, a thiol group and a halogen or a cluster of said organic compound with an ion beam which accelerates ionized species towards a substrate by an electric field and forming a carbon film on the substrate.

DETAILED DESCRIPTION OF THE INVENTION

According to the present invention, as the raw material, an organic compound having a substituent which is bonded to a molecule at a bond energy which is lower than a carbon-hydrogen bond energy is used. Examples of such substituent are a substituent which is bonded through a carbon-carbon bond (e.g., a carbonyl group, an aldehyde group, an acyl group and an acid anhydride group), a substituent which is bonded through a carbon-nitrogen bond (e.g., an amino group and a nitro group), a substituent which is bonded through a carbon-oxygen or carbon-sulfur bond (e.g., a hydroxyl group, an alkoxyl group and a thiol group) and a substituent which is bonded through a carbon-halogen bond (e.g., chlorine, bromine and iodine). The energies of dissociation of these substituent from a methyl group and a phenyl group are shown in Table 1.

TABLE 1

| Substituent | Energy of dissociation (kcal/mol) | |
| --- | --- | --- |
| | $-CH_3$ | $-C_6H_5$ |
| (H) | 101 | 102 |
| —CHO | 71–75 | 83* |
| —COCH$_3$ | 71 | — |
| —COCl | 90 | 96 |
| —OH | 90 | 107* |
| —SH | 67 | — |
| —NH$_2$ | 79 | 94* |
| —NO$_2$ | 57 | 62 |
| —Cl | 80 | 88* |
| —Br | 66–67 | 71 |
| —I | 54–57 | 57* |

Note:
*A calculated value.

Although there is no measured value of energy of dissociation for the acid anhydride group, this group may have a similar energy of dissociation to that of the acyl group in view of the similarity of chemical structures of these groups.

Among the organic compounds having such group, acid anhydrides are preferably used, since carbon dioxide and carbon monoxide generated by decomposition of the acid anhydride are non-corrosive stable gases and do not remain in the produced carbon film. Among the acid anhydrides, those having a unsaturated hydrocarbon, preferably an aromatic hydrocarbon as a base structure are preferred due to good efficiency of carbonization. Preferred examples of the acid anhydride are 3,4,8,10-perylenetetracarboxylic dianhydride, 1,4,5,8-naphthalenetetracarboxylic dianhydride, 1,2,4,5-benzenetetracarboxylic dianhydride and a mixture thereof.

Figure 1:
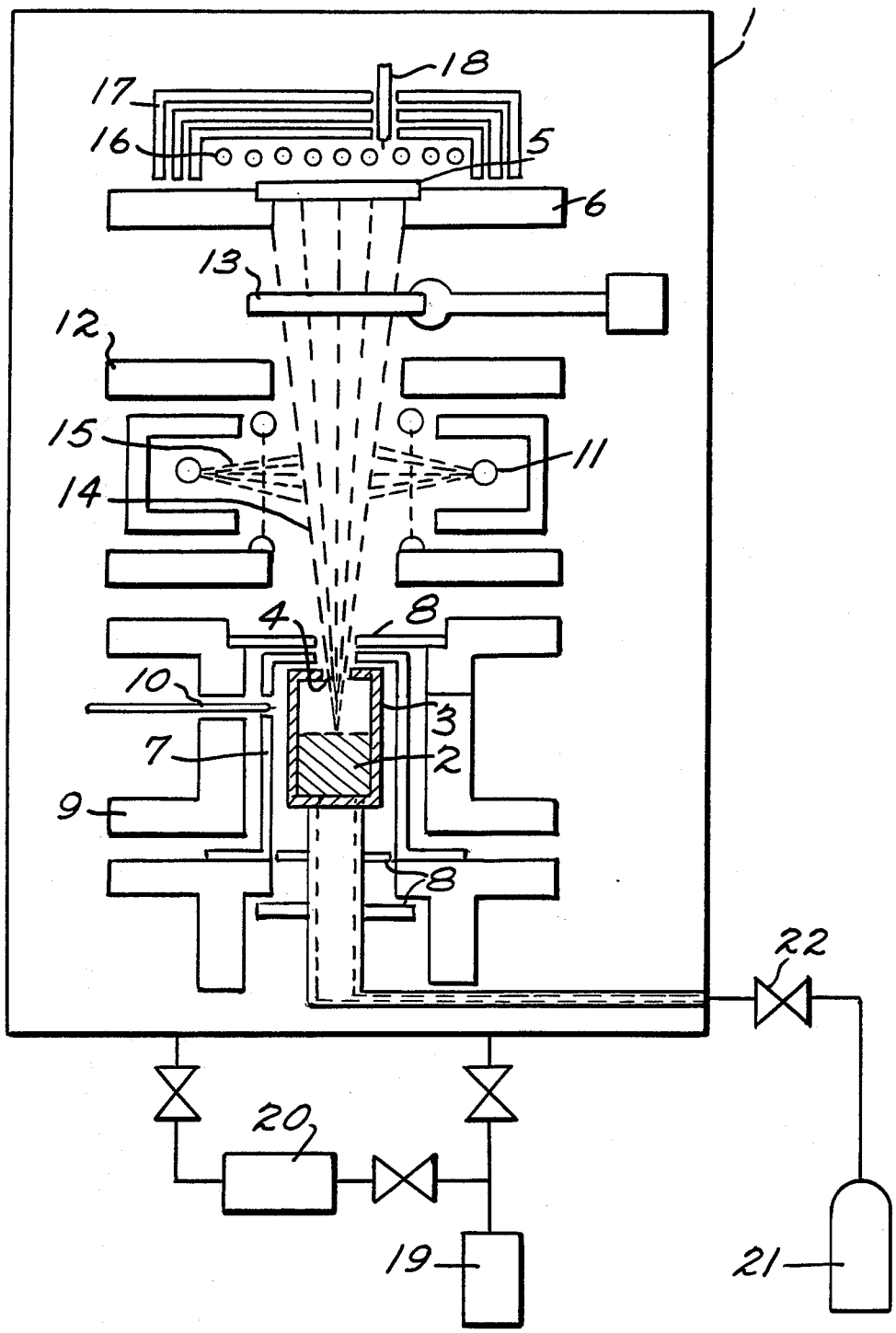
FIG. 1 is a schematic cross sectional view of one embodiment of an ion beam generating apparatus for practicing the method of the present invention.

The ion beam method utilized by the method of the present invention directly ionizes the raw material compound or its cluster and accelerates the ionized species towards the substrate by the electric field. A typical ion beam apparatus is shown in FIG. 1 (cf. H. Usui et al, J. Vac. Technol., A4(1), 52 (1986)), although other ion beam apparatuses can be used in the present invention.

The apparatus of FIG. 1 is now explained in detail.

In a vacuum chamber 1, a crucible 3 containing a raw material 2 is placed. On an upper wall of the crucible 3, a nozzle 4 for injecting the raw material. At the upper position over the nozzle 4, a substrate 5 is set on a substrate holder 6.

Around the crucible 3, a graphite heater 7 for heating the crucible is installed. Around the graphite heater 7, a heat insulating plate 8 and a cooling jacket 9 are provided. Between the nozzle 4 and the substrate 5, successively installed are an electron emission filaments 11 for ionizing the raw material which is injected from the nozzle 4, an ion accelerating electrode 12 for accelerating the ions towards the substrate and a shutter 13. The electron emission filaments 11 are positioned so that the electrons are emitted against the injected raw material from three directions. Between each electron emission filament and the raw material beam, there is an electron accelerating electrode (grid) 15.

Over the substrate 5, installed are a thermocouple 18, a heater 16 for heating the substrate 5 and a heat insulating plate 17 for preventing heat diffusion from the heater 16.

For evacuating the interior of the chamber 1 of FIG. 1, an oil-sealed rotary vacuum pump 19 and an oil diffusion pump 20 are attached.

A material of the substrate to be used in the method of the present invention may be any of conventionally used ones. Examples of the substrate material are metals (e.g., iron, nickel and aluminum), semiconductive materials (e.g., Si, Ge, GaAs and InP), metal oxides (e.g., $SiO_2$, $Al_2O_3$ and $TiO_2$), carbonaceous materials (e.g., graphite, diamond, diamond-like carbon and carbon fibers), crystalline alkali halide materials (e.g., NaCl and KBr) and polymeric materials (e.g., polyimide and polytetrafluoroethylene).

When the apparatus of FIG. 1 is used, the electrically conductive carbon film can be produced according to the present invention as follows:

A substrate, for example, a silicon wafer substrate which has been washed and well dried is set on the substrate holder 6. The interior of the chamber 1 is evacuated to, for example, 1 to $2 \times 10^{-6}$ mmHg by an evacuation system comprising the oil-sealed rotary vacuum pump 19 and the oil diffusion pump 20. After the substrate is preheated at 300° C. for one hour to remove absorbed impurities, it is cooled to a room temperature. Then, the raw material is injected from the nozzle 4. In this case, supply of the raw material is adjusted by heating the crucible 3 containing the raw material when the raw material is solid at room temperature or by controlling a pressure adjusting valve 22 which communicates with the nozzle 4 while optionally heating a container 21 containing the raw material when the raw material is liquid or gas at room temperature.

After the reduced pressure is stabilized, a voltage of several ten to several hundred volts is applied between the electron emission filament 11 through which electric currents has been flowed and the electron accelerating electrode 15.

The ionized compound is accelerated by a voltage applied to the ion accelerating electrode 12.

After the reduced pressure and the ionization current are stabilized, the shutter 13 is opened to start the ion beam deposition of carbon on the surface of the substrate 5.

According to the present invention, since the raw material is the easily decomposable organic compound, it is carbonized by a smaller amount of energy than that required for ionizing the conventionally used hydrocarbon. Further, since the ion beam method is employed, an activation effect of the ions during the film forming step and the effect of kinetic energy may be used instead of activation by thermal energy which is utilized in the pyrolysis. As the result, the carbon film having better electrical conductivity can be formed at a lower temperature than the pyrolysis.

PREFERRED EMBODIMENTS OF THE INVENTION

Example 1

As the substrate, a silicon (111) wafer (N-type, a thickness of 0.4 mm) was used and set on the substrate holder 6 in the chamber 1 of the apparatus shown in FIG. 1. After setting the crucible containing 3,4,8,10-perylenetetracarboxylic dianhydride, the interior of the chamber was evacuated, and the substrate was preheated as described above. Then, the ion beam deposition was carried out under the following conditions to form a carbon film with metallic luster on the substrate:

Crucible temperature: 380°–400° C.
Substrate temperature: Room temperature
Current through the electron emission filaments: 30 A
Electron accelerating voltage: 500 V
Ion accelerating voltage: 5 kV
Deposition time: 10 minutes The formed carbon film had a thickness of about 0.7 $\mu$m and an electrical conductivity at room temperature of 44 S/cm.

Example 2

In the same manner as in Example 1 but applying the ion accelerating voltage of 4 kV, a carbon film with metal luster was formed on the substrate. The carbon film had a thickness of about 1.0 $\mu$m and an electrical conductivity at room temperature of 6 S/cm.

Example 3

In the same manner as in Example 1 but applying the ion accelerating voltage of 3 kV, a silver gray carbon film was formed on the substrate. The carbon film had a thickness of about 3.3 $\mu$m and an electrical conductivity at room temperature of $10^{-2}$ S/cm.

Comparative Example 1

The silicon (111) wafer as a substrate and 3,4,8,10-perylenetetracarboxylic dianhydride as a raw material were used. After evacuating the interior of the chamber and preheating the substrate, the crucible containing the raw material was heated at a temperature of 380° to 400° C., and the raw material was vacuum deposited on the substrate kept at room temperature for 10 minutes to form a greenish gray deposited film having a thickness of about 3.2 $\mu$m. This film was electrically insulating.

Figure 2:
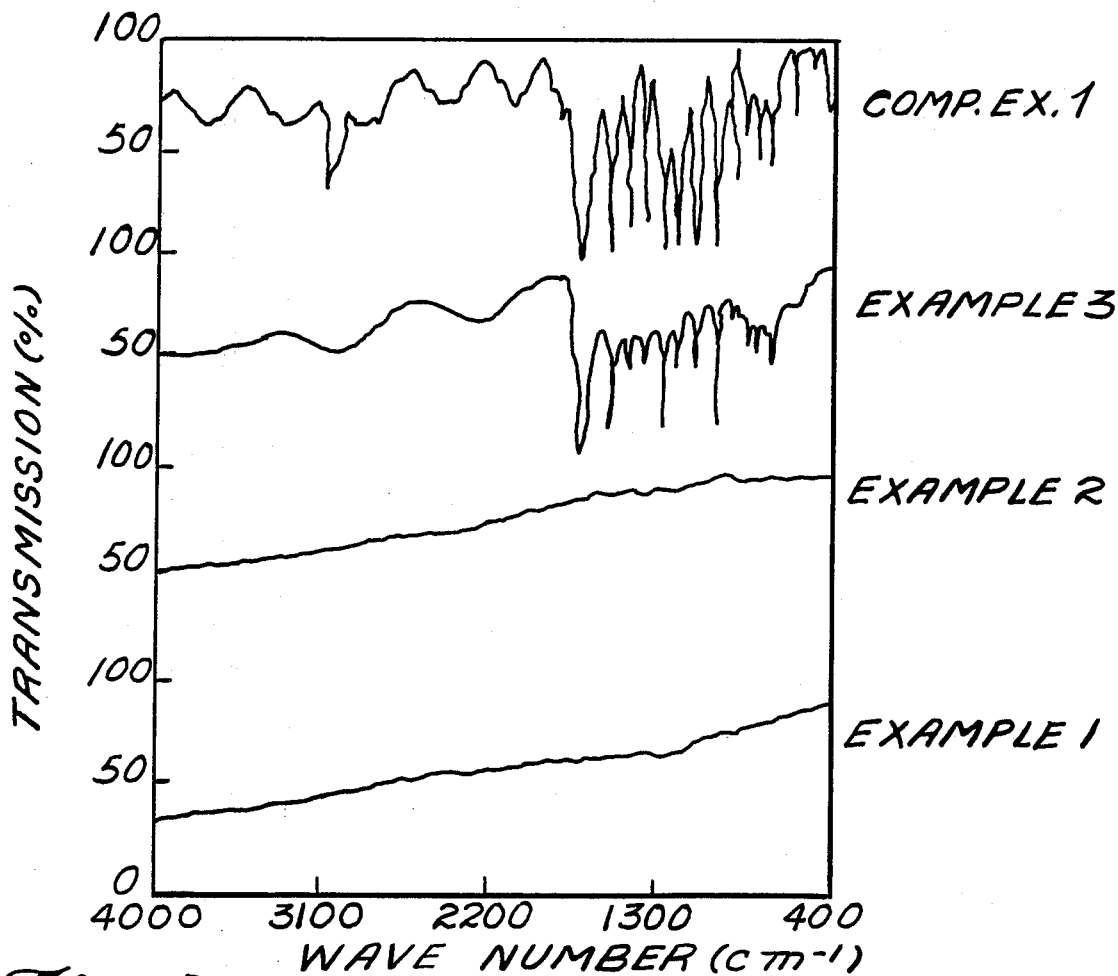
FIG. 2 shows the FT-IR spectra of the carbon films produced in Examples 1-3 and Comparative Example 1 and FIG. 3 shows an Auger spectrum of the carbon film produced in Example 1.
Figure 3:
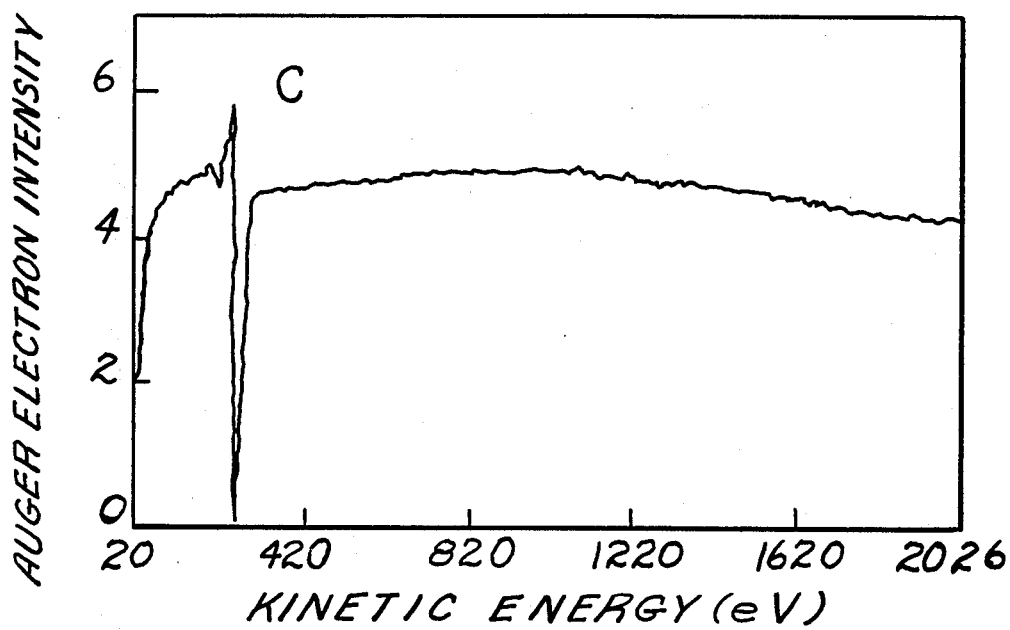

FIG. 2 shows FT-IR spectra of the films produced in Examples 1–3 and Comparative Example 1, and FIG. 3 shows an Auger spectrum of the carbon film produced in Example 1. From these spectra, it is understood that as the ion accelerating voltage is increased, the raw material is effectively decomposed so that carbonization is facilitated.

Examples 4–7 and Comparative Examples 2–3

In the same manner as in Example 1 but using, as a raw material, 1,4,5,8-naphthalenetetracarboxylic dianhydride or 1,2,4,5-benzenetetracarboxylic dianhydride and applying an ion accelerating voltage of Table 2, a carbon film was produced on the substrate. The results are shown in Table 2.

TABLE 2

| Example No. | Raw material | Substrate temp. (°C.) | Ion accelerating voltage (kV) | Film thickness ($\mu$m) | Electrical conductivity (S/cm) |
|---|---|---|---|---|---|
| Ex. 1 | PTCDA[1]* | Room temp. | 5 | 0.7 | $4.4 \times 10^1$ |
| Ex. 2 | ↑ | ↑ | 4 | 1.0 | $6.0 \times 10^0$ |
| Ex. 3 | ↑ | ↑ | 3 | 3.3 | $1.0 \times 10^{-2}$ |
| Comp. 1 | ↑ | ↑ | — | 3.2 | Insulator |
| Ex. 4 | NTCDA*[2] | ↑ | 4 | 0.2 | $2.9 \times 10^2$ |
| Ex. 5 | ↑ | ↑ | 3 | 0.1 | $8.0 \times 10^1$ |
| Comp. 2 | ↑ | ↑ | — | 10.4 | Insulator |
| Ex. 6 | BTCDA*[3] | ↑ | 3 | 0.1 | $1.7 \times 10^2$ |
| Ex. 7 | ↑ | ↑ | 2 | 0.1 | $4.6 \times 10^1$ |
| Comp. 3 | ↑ | ↑ | — | 13.6 | Insulator |

Note:
*[1]3,4,9,10-Perylenetetracarboxylic dianhyride.
*[2]1,4,5,8-Naphthalenetetracarboxylic dianhydride.
*[3]1,2,4,5-Benzenetetracarboxylic dianhydride.

As is understood from the results in Table 2, even if the carboxylic anhydride is used, the films produced in Comparative Examples 1, 2 and 3 in which the ion beam method was not employed are electrically insulating, while the carbon films having the electrical conductivity of $10^{-2}$ to $10^2$ S/cm were produced on the substrate kept at room temperature in Examples in which the ion beam method was employed. It is also understood that as the ion accelerating voltage increases, the electrical conductivity of the carbon film increases.

Example 8

As the substrate, a silicon (111) wafer (N-type, a thickness of 0.4 mm) was used and set on the substrate holder 6 in the chamber 1 of the apparatus shown in FIG. 1. After setting the crucible containing phthalic anhydride, the interior of the chamber was evacuated, and the substrate was preheated as described above. Then, the ion beam deposition was carried out under the following conditions to form a brown carbon film on the substrate:

Crucible temperature: 90°–120° C.
Substrate temperature: Room temperature
Current through the electron emission filaments: 30 A
Electron accelerating voltage: 500 V
Ion accelerating voltage: 3 kV
Deposition time: 10 minutes The formed carbon film had a thickness of about 0.3 $\mu$m and an electrical conductivity at room temperature of 10 S/cm.

Example 9

In the same manner as in Example 8 but using 1,2,4,5-tetrachlorobenzene as a raw material, a brown carbon film was produced on the substrate. The carbon film had a thickness of about 0.1 $\mu$m and an electrical conductivity at room temperature of 150 S/cm.

Comparative Example 4

In the same manner as in Example 8 but using benzene as a raw material, formation of a carbon film was tried but fail.

Comparative Example 5

In the same manner as in Example 8 but using catechol as a raw material, a white film having a thickness of about 0.3 μm was produced. But, the film was electrically insulating.

Examples 10–13 and Comparative Examples 6–7

In the same manner as in Example 8 but using an organic compound shown in Table 3 as a raw material and applying an ion accelerating voltage shown in Table 3, a carbon film was produced. The results are shown in Table 3.

TABLE 3

| Example No. | Raw material | Substrate temp. (°C.) | Ion accelerating voltage (kV) | Film thickness (μm) | Electrical conductivity (S/cm) |
|---|---|---|---|---|---|
| Ex. 1 | PTCDA | Room temp. | 5 | 0.7 | $4.4 \times 10^1$ |
| Comp. 6 | Perylene | ↑ | ↑ | 0.6 | Insulator |
| Ex. 4 | NTCDA | ↑ | 4 | 0.2 | $2.9 \times 10^2$ |
| Comp. 7 | Naphthalene | ↑ | ↑ | 0.4 | Insulator |
| Ex. 6 | BTCDA | ↑ | 3 | 0.1 | $1.7 \times 10^2$ |
| Ex. 8 | PA*[4] | ↑ | ↑ | 0.3 | $1.0 \times 10^1$ |
| Ex. 9 | 1,2,4,5-Cl—B*[5] | ↑ | ↑ | 0.1 | $1.5 \times 10^2$ |
| Ex. 10 | 1,2-Cl—B*[6] | ↑ | ↑ | 0.3 | $1.1 \times 10^1$ |
| Ex. 11 | 1,2-NH$_2$—B*[7] | ↑ | ↑ | 0.4 | $2.0 \times 10^0$ |
| Ex. 12 | 1,2-NO$_2$—B*[8] | ↑ | ↑ | 0.3 | $8.0 \times 10^0$ |
| Comp. 4 | Benzene | ↑ | ↑ | — | No film |
| Comp. 5 | Catechol | ↑ | ↑ | 0.3 | Insulator |
| Ex. 13 | cis-DE*[9] | ↑ | ↑ | 0.1 | $2.0 \times 10^1$ |

Note:
*[4]Phthalic anhydride
*[5]1,2,4,5-Tetrachlorobenzene
*[6]1,2-Dichlorobenzene
*[7]o-Toluidine
*[8]1,2-Dinitrobenzene
*[9]cis-Dichloroethylene As is clear from the results of Table 3, when the organic compound having the substituent with a smaller energy of dissociation than the hydrogen atom is used as the raw material, the electrically conductive carbon film can be formed on the substrate kept at room temperature by the ion beam method. On the contrary, when the organic compound having the substrate with a larger energy of dissociation than the hydrogen atom or the organic compound having no substituent is used as the raw material, no electrically conductive carbon film is formed on the substrate kept at room temperature by the ion beam method.

Among the organic compounds having the substituent with a smaller energy of dissociation than the hydrogen atom, the acid anhydrides and the halogen-containing organic compounds give the carbon films having a larger electrical conductivity.

Since the halogen-containing organic compounds reduce the life of the electron emission filaments due to generation of the halogen gas by the decomposition of the compound, the acid anhydride is more preferable than the halogen-containing organic compound.

Examples 14 and 15

In the same manner as in Example 4 but using a substrate shown in Table 4, a carbon film was produced. The results are shown in Table 4.

TABLE 4

| Example No. | Substrate | Substrate temperature (°C.) | Film thickness (μm) | Electrical conductivity (S/cm) |
|---|---|---|---|---|
| 4 | Si | Room temp. | 0.2 | $2.9 \times 10^2$ |
| 14 | InP | ↑ | 0.2 | $2.6 \times 10^2$ |
| 15 | Polyimide | ↑ | 0.2 | $2.0 \times 10^2$ |

On any substrate, the carbon film having an electrical conductivity in the order of $10^2$ S/cm was produced. Since the polyimide film is heat resistant up to a temperature of 310° to 365° C., and phosphorus liberates from InP at about 540° C., the method of the present invention by which the carbon film can be formed on the substrate kept at lower temperature is very important for forming the electrically conductive carbon film on these substrate.

Examples 16–18

In the same manner as in Example 1 but changing the substrate temperature as shown in Table 5, a carbon film was formed on the silicon wafer. The results are shown in Table 5.

TABLE 5

| Example No. | Raw material | Substrate temperature (°C.) | Film thickness (μm) | Electrical conductivity (S/cm) |
|---|---|---|---|---|
| 1 | PTCDA | Room temp. | 0.7 | $4.4 \times 10^1$ |
| 16 | ↑ | 400 | 0.3 | $2.2 \times 10^2$ |
| 17 | ↑ | 700 | 0.2 | $3.6 \times 10^2$ |
| 18 | ↑ | 1,000 | 0.2 | $4.0 \times 10^2$ |

As is clear from the results of Table 5, as the substrate temperature increases, the electrical conductivity of the formed carbon film increases.

It was reported that, by the conventional pyrolysis of PTCDA, the carbon film having the electrical conductivity of 15–250 S/cm was formed at a temperature of 700° to 900° C., and by the ion beam method utilizing benzene as the raw material, the carbon film having the electrical conductivity of 90–170 S/cm was formed at a temperature of 400° to 1,000° C. According to the present invention, the carbon film formed in the same temperature range has a larger electrical conductivity than the carbon films formed by the conventional methods.

What is claimed is:

1. A method for forming an electrically conductive carbon film on a substrate comprising the steps of:
   maintaining a substrate at substantially room temperature; and
   ionizing an organic compound having at least one substituent selected from the group consisting of a carbonyl group, an aldehyde group, an acyl group, an acid anhydride group, an amino group, a nitro group, a hydroxyl group, an alkoxyl group, a thiol group and a halogen or a cluster of said organic compound with an ion beam which accelerates ionized species towards the substrate by an electric field thereby forming a carbon film on the substrate.

2. The method according to claim 1, wherein the organic compound is a carboxylic anhydride.

3. The method according to claim 2, wherein the carboxylic anhydride is at least one selected from the group consisting of 3,4,8,10-perylenetetracarboxylic dianhydride, 1,4,5,8-naphthalenetetracarboxylic dianhydride and 1,2,4,5-benzenetetracarboxylic dianhydride.

* * * * *